United States Patent
Barnes

(10) Patent No.: US 6,366,133 B1
(45) Date of Patent: Apr. 2, 2002

(54) LOGIC CIRCUIT

(75) Inventor: William Bryan Barnes, Bristol (GB)

(73) Assignee: STMicroelectronics Limited, Almondsbury (GB)

( * ) Notice: Subject to any disclaimer, the term of this patent is extended or adjusted under 35 U.S.C. 154(b) by 0 days.

(21) Appl. No.: 09/498,765

(22) Filed: Feb. 4, 2000

(30) Foreign Application Priority Data

Feb. 12, 1999 (GB) .............................................. 9903253

(51) Int. Cl.⁷ ............................................. H03K 19/017
(52) U.S. Cl. ............................ 326/121; 326/83; 326/27
(58) Field of Search ................................. 326/112, 119, 326/121, 83, 86, 26, 27

(56) References Cited

U.S. PATENT DOCUMENTS

| | | | |
|---|---|---|---|
| 4,507,574 A | | 3/1985 | Seki et al. |
| 4,716,308 A | * | 12/1987 | Matsuo et al. ............... 326/121 |
| 4,851,716 A | | 7/1989 | Needles et al. |
| 5,889,416 A | * | 3/1999 | Lovett ........................ 326/121 |
| 5,973,514 A | * | 10/1999 | Kuo et al. ................... 326/121 |
| 5,986,478 A | * | 11/1999 | Ohashi ........................ 326/121 |
| 6,023,181 A | * | 2/2000 | Penny et al. ................ 327/291 |

FOREIGN PATENT DOCUMENTS

EP 0 283 228 9/1988

OTHER PUBLICATIONS

Patent Abstracts of Japan, vol. 1998, No. 10, Aug. 31, 1998 & JP 10 125798 A (NEC CORP), May 15, 1998.
Patent Abstracts of Japan, vol. 010, No. 224 (E–425), Aug. 5, 1986 & JP 61 060013 A (Fujitsu LTD), Mar. 27, 1986.

* cited by examiner

Primary Examiner—Michael Tokar
Assistant Examiner—Don Phu Le
(74) Attorney, Agent, or Firm—Wolf, Greenfield & Sacks, P.C.; James H. Morris; Robert A. Skrivanek, Jr.

(57) ABSTRACT

A wordline driver has enable circuitry optimized for positive-going input transitions and disable circuitry optimized for transitions in a disable input which would cause the output to become disabled. The optimization is achieved by suitably dimensioning the transistors in the respective enable and disable circuits for suitable current-carrying ability.

7 Claims, 3 Drawing Sheets

LOGIC CIRCUIT

FIELD OF THE INVENTION

The present invention relates to a CMOS logic circuit, and more particularly but not exclusively to a CMOS logic circuit for use as a line driver.

BACKGROUND OF THE INVENTION

The well known problem when driving capacitive loads in integrated circuits, such as capacitive lines, is to provide a rapid transition in voltage on the line. One requirement for achieving this aim is to provide an output circuit having a high current capacity but it is also important to drive the output circuit itself with fast transitions in such a way as to enable the output circuit to behave optimally.

One of the problems with known driver circuits is that logic elements in the driver circuitry are required to respond rapidly to both positive-going and negative-going transitions to operate the output circuitry: fast circuitry tends to have small dimensions, and thus low current capacity.

It is an object of the present invention to at least partly overcome the problems of the prior art.

SUMMARY OF THE INVENTION

According to a first aspect of the present invention there is provided a CMOS logic circuit having plural inputs and a circuit output, the logic circuit having a first stage and a second stage, the first stage receiving the plural inputs and providing two first stage outputs, the second stage having an output node connected to said circuit output and two current paths connected between said output mode and a reference voltage-receiving node, each of said current paths being substantially identical, and having a first transistor connected to said output node and a second transistor connected to said voltage-receiving node, said first and second transistors being connected in series, wherein each of said first stage outputs is coupled to the control gates of a first transistor in a respective one of said current paths and a second transistor in a respective other current path.

According to a second aspect of the present invention there is provided a CMOS logic circuit having plural inputs and a circuit output, the logic circuit having a first stage and a second stage, the first stage receiving said plural inputs and providing a first stage output, the second stage receiving a first stage output and providing a second stage output which is coupled to said circuit output, wherein the first stage comprises plural two input logic gates, each of said logic gates being configured to have a higher current capability in response to an input transition of one polarity than to an input transition of the opposite polarity, such that said transition of said one plurality causes said circuit output to assume a first logic value, and said second stage having a control input, the second stage being configured to have a higher current capability in response to a first polarity transition at said control input than to a second opposite polarity transition at said control input, wherein said first polarity transition causes said circuit output to assume a second logic value opposite to said first logic value.

Preferably the first stage output is coupled to an inverter for driving an output capacitive load.

Advantageously said second stage comprises two current paths connected between said second stage output and a reference voltage-receiving node, each of said current paths having a first transistor connected to said second stage output and a second transistor connected to a reference voltage-receiving node, wherein said first and second transistors are connected in series, and said first stage has two outputs each of said outputs being coupled to the control gates of a first transistor and a respective one of said current paths and a second transistor in a respective other current path, said control input comprising said reference voltage-receiving node.

Preferably said first stage comprises a plurality of CMOS logic gates, each of said gates having P conductivity transistors and N conductivity transistors, wherein the width of the P conductivity transistors is larger than the width of the N transistors Preferably the first and second transistors of the second stage are N conductivity transistors, and said second stage further comprises at least one P transistor wherein the width of the N conductivity transistors is substantially greater than that of the P transistor.

According to a third aspect of the present invention there is provided a CMOS logic circuit for driving a capacitive load, having an input circuit and an output circuit, the output circuit having an output to which, in use, said capacitive load is connected the input circuit having at least one CMOS logic gate comprising P and N conductivity transistors, wherein the width of the P conductivity transistors is substantially greater than that of the N conductivity transistors whereby said input stage provides transitions at the output of the output stage into said capacitive load which are faster in one sense than in the other sense and said output circuit comprises P conductivity and N conductivity transistors receiving an output from said input stage and further receiving a control input, whereby the dimensions of said P and N type transistors of said output stage are selected to provide faster output transitions into said capacitive load in said second sense than in said first sense.

BRIEF DESCRIPTION OF THE DRAWINGS

The present invention will now be described with reference to two preferred embodiments in the following drawings in which.

DESCRIPTION OF PREFERRED EMBODIMENTS

Figure 1:
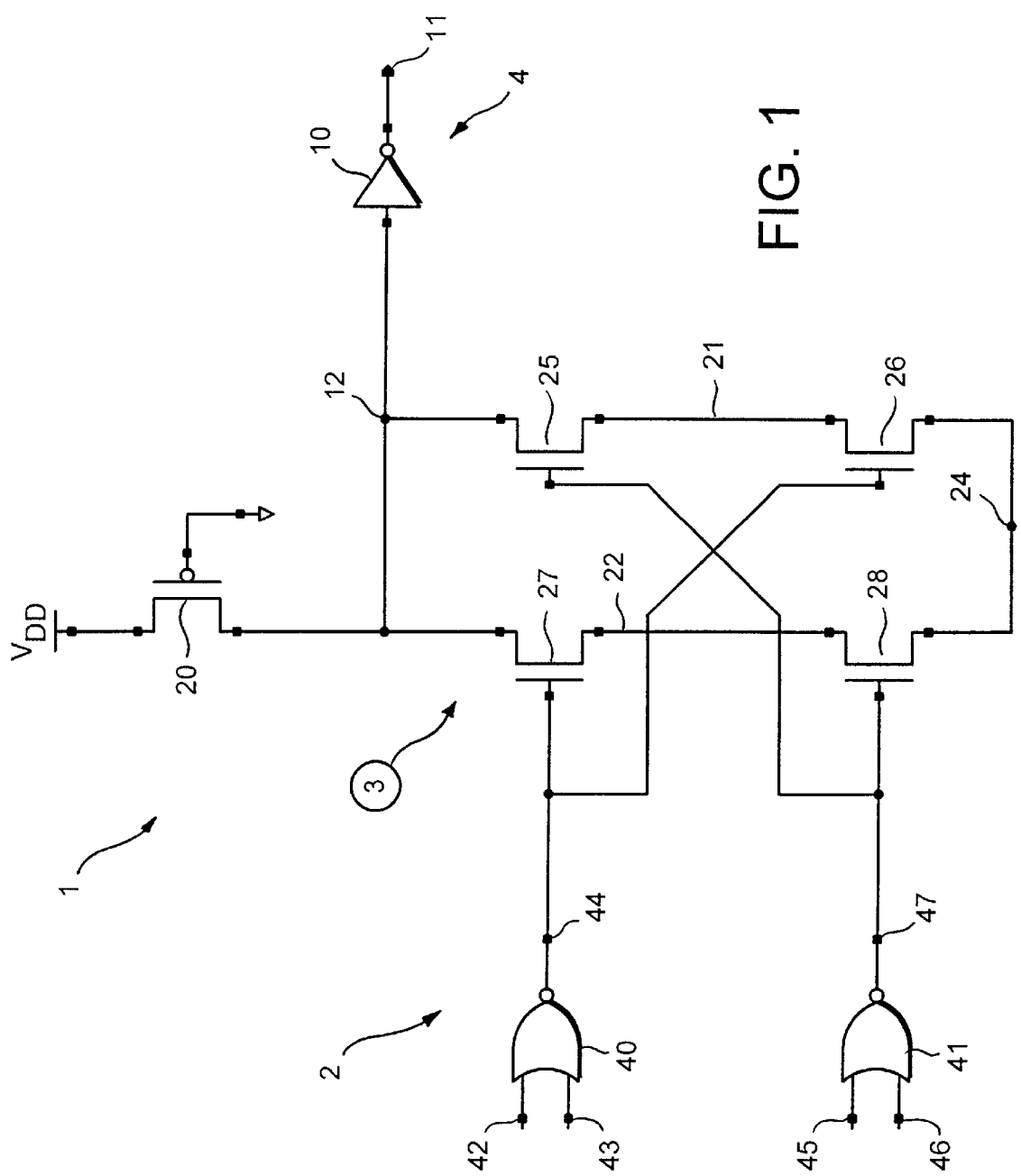
FIG. 1 shows a first embodiment of a line driver circuit in accordance with the present invention.

In the various figures like reference numerals will refer to like parts.

Referring to FIG. 1 a line driver circuit 1 consists generally of three stages, namely an input stage 2, a second stage 2 and an output stage 4. The output stage 4 consists of an output inverter 10 having an output terminal 11 which constitutes the circuit output and an input node 12. The input node 12 is the output node of the second stage 3 which consists of a P type transistor 20 coupled between the output node 12 and a positive supply VDD, and further comprises two parallel current paths 21, 22 connected between the output node 12 and a circuit node 24. The first current path 21 consists of a first N type transistor 25 having its drain connected to the output node 12 and its source connected to the drain of a second N type transistor 26, the source of the second type transistor 26 being connected to the circuit node 24. Similarly the second circuit path 22 consists of a first N type transistor 27 having its drain connected to the output node 12 and its source connected to the drain of a second N type transistor 28, whose source is connected commonly to that of the second transistor 26 of the first current path to the circuit node 24. The N type transistors are substantially identical in width to one another and of greater width, for example four times greater, than the width of the P type transistor 20. The gate of the first transistor 25 of the first current path 21 is connected to the gate of the second transistor 28 of the second current path 22 and the gate of the first transistor 27 of the second current path 22 is connected to the gate of the second transistor 26 of the first current path 22.

The input stage comprises two input CMOS NOR gates 40 and 41. The first NOR gate 40 has two input nodes 42 and 43 and an output node 44 which is connected to the commoned gates of the first transistor 27 of the second current path 22 and the second transistor 26 of the first current path 21, Similarly the second NOR gate 41 has two inputs 45 and 46 and an output 47 the output being connected to the commoned gates of the second transistor 28 of the second current path 22 and the first transistor 25 of the first current path 21.

As noted above, the NOR gates are CMOS devices, and thus comprise both P conductivity and N conductivity transistors. The width of the P transistor is greater, for example six times greater, than that of the N transistors.

Figure 2:
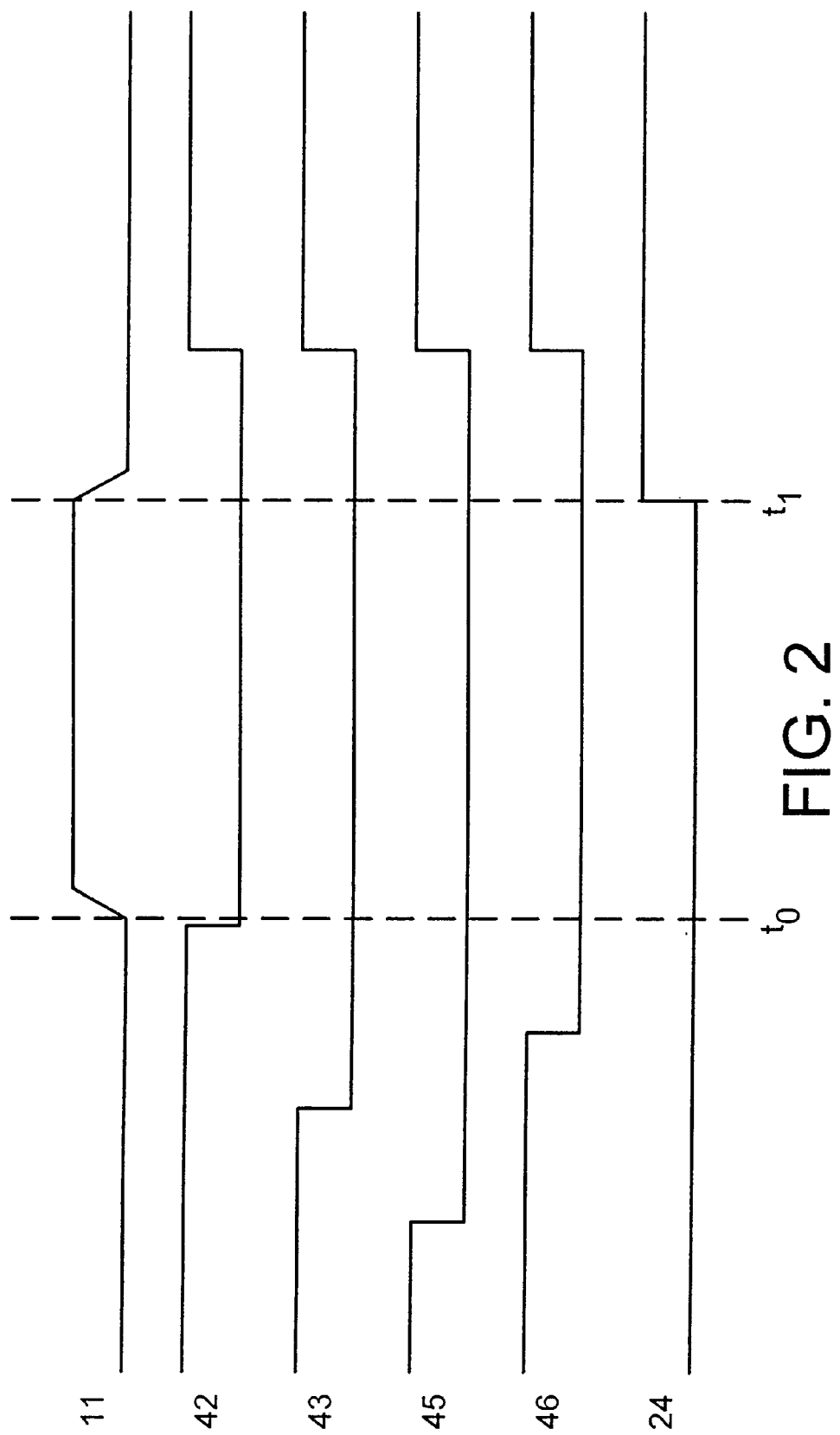
FIG. 2 shows a timing diagram for the embodiment of FIG. 1

Operation of the circuit of FIG. 1 will now be described with additional reference to FIG. 2. The embodiment is a wordline driver and output 11 shows the voltage on the wordline which is enabled in response to the latest-negative going transition of one of the inputs 42–46, in this case input 42. Disablement of the wordline, in other words transition from logic level 1 to logic level 0 occurs at time T1 in response to a transition at node 24 which must occur before the circuit inputs 42,43,45,46 have returned to logic 1.

It will be understood by those skilled in the art that for the output terminal to be at a logical high level, the output node 12 of the second stage must be at a low level. For this to occur both the NOR gates 40 and 41 must have high potentials at their output terminals 44 and 47, so that both current paths 21 and 22 are enabled, and circuit node 24 must be connected to a low voltage, for example reference voltage VSS.

If only one of the NOR gates 40, 41 has a high potential at its output then neither of the two current paths 21 and 22 will conduct since one transistor in each current path will be blocked.

For the output of the NOR gate to be at logic one, both of the inputs will be at logic zero.

Thus it will be understood that for all conditions where the inputs are other than logic zero the circuit output 11 will be at a low potential. The operation of the circuit will therefore be considered starting from the conditions where circuit inputs 43, 45 and 46 are at logic zero but circuit input 42 is at logic one. In this state, the second NOR gate 41 has a high output at its output node 47 but the first NOR gate 40 has a low output at its output 44. If the first input 42 makes a transition from high to low, the relatively large P type transistors in the NOR gate 40 will cause the gate output node 44 to change in potential relatively rapidly from a logic zero to a logic one state. This will rapidly drive the first transistor 27 of the second current path 22 and the second transistor 26 of the first current path 21 to a saturated condition and cause the output node 12 to fall rapidly to logic zero. By contrast, at a later transition in the first input from logic zero to logic one, the output 44 of the first NOR gate 40 will change in potential relatively slowly from logic one to logic zero due to the relatively small current carrying capacity of the N type transistors in the NOR gate 40.

To ensure a fast rise in potential at second stage output node 12 the circuit node 24 is driven from a separately-derived disable potential which is at a logic low potential when the inputs to the NOR gates are required to switch the line connected to output terminal 11 and which is raised to logic one at times when it is required to disable the line connected to the terminal 1.

The fast rise on the output node 12 of the second stage will occur in part due to the fact that the rising potential on the circuit node 24 is conducted through the conductive N transistors 25–28 of the first and second current paths acting as source followers. Thus it is essential that the potential difference supplied to the circuit is sufficient to overcome the relevant threshold voltage of the transistors in this embodiment. Where a low voltage operation is intended, a modified circuit is required.

The symmetrical nature of the current paths 21 and 22 reduces the possibility of charge storing on the gates of the transistors This in turn allows the width of the P transistor 20 to be relatively low.

Figure 3:
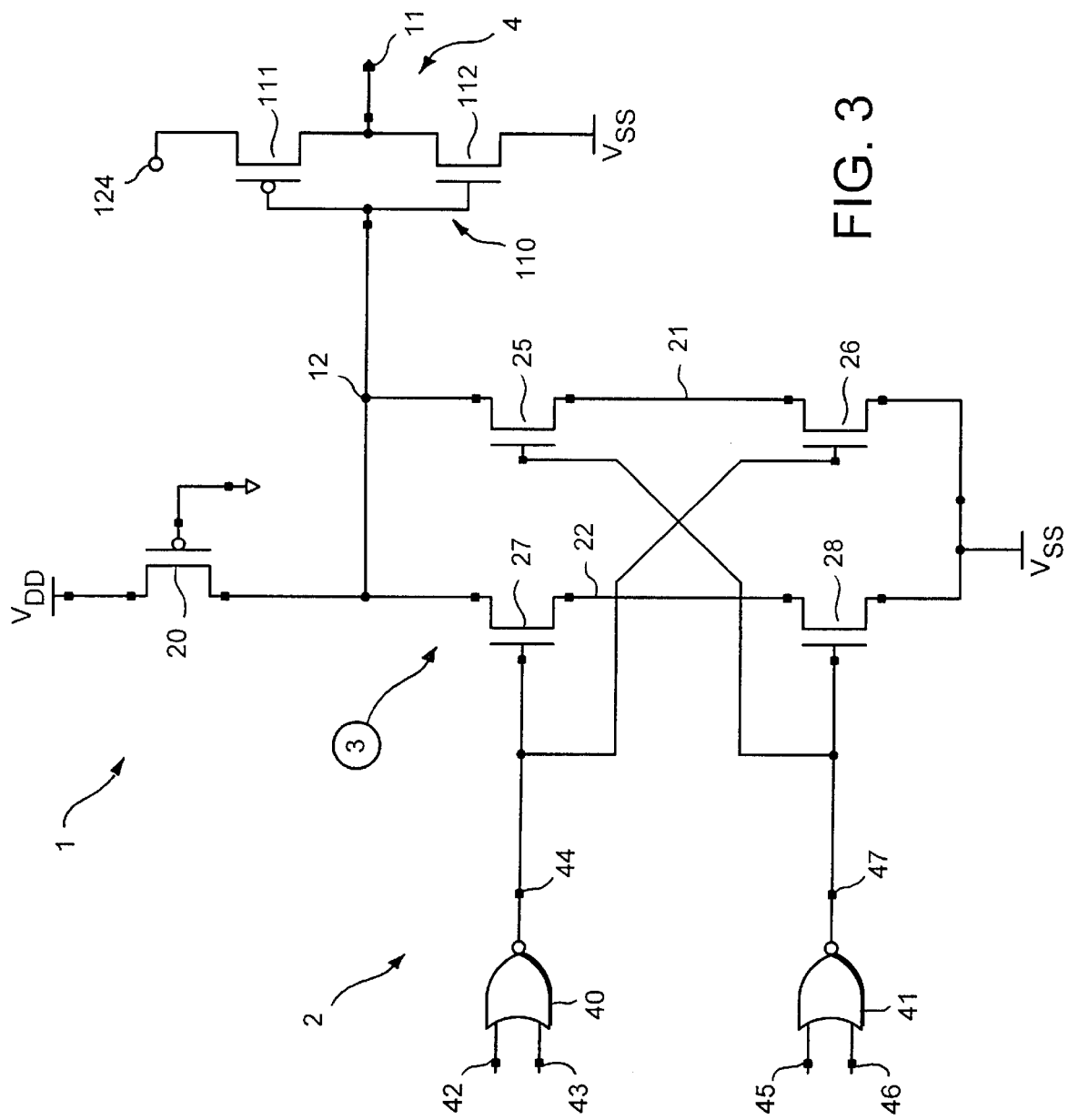
FIG. 3 shows a second embodiment of a line driver circuit in accordance with the present invention.

Referring to the second embodiment, it will be noted that the circuit of FIG. 3 is substantially similar to that of FIG. 1 with the exception that circuit node 24 is now permanently connected to a reference potential and the control input for disabling the output at node 11 is provided by input node 124 supplied to the output inverter 110. This arrangement may under certain circumstances be advantageous with respect to the embodiments shown in FIG. 1 because the control input which disables the output is provided as close as possible to the output itself.

In the inverter 110, it will be seen that the control input 124 forms the positive supply VDD to the P conductivity transistor of the inverter. In this case, the voltage applied to the control input 124 is the inverse of that provided to the control node 24 of the first embodiment so that node 124 is at a high potential during enabling operation and at a low potential during disabling operation.

What is claimed is:

1. A CMOS logic circuit having plural inputs and a circuit output, the logic circuit having a first stage and a second stage, the first stage receiving the plural inputs and providing two first stage outputs, the second stage having an output connected to said circuit output and two current paths connected between said output and a reference voltage-receiving node, each of said current paths being substantially identical, and having a first transistor connected to said second stage output and a second transistor connected to said voltage-receiving node, said first and second transistors being connected in series;

wherein each of said first stage outputs is coupled to the control gates of a first transistor in a respective one of said current paths and a second transistor in a respective other current path;

wherein the first and second transistors of the second stage are N conductivity transistors, and said second stage further comprises at least one P conductivity transistor; and wherein the width of the N conductivity transistors of said second stage is substantially greater than that of the at least one P conductivity transistor of said second stage.

2. A CMOS logic circuit having plural inputs and a circuit output, the logic circuit having a first stage and a second stage, the first stage receiving said plural inputs and providing at least one first stage output, the second stage receiving said at least one first stage output and providing a second stage output which is coupled to said circuit output, wherein the first stage comprises plural two input logic gates, each of said logic gates being configured to have a higher current capability in response to an input transition of one polarity than to an input transition of the opposite polarity, such that said transition of said one polarity causes said circuit output to assume a first logic value, and said second stage having a control input, the second stage being configured to have a higher current capability in response to a first polarity transition at said control input than to a second opposite polarity transition at said control input, wherein said first polarity transition causes said circuit output to assume a second logic value opposite to said first logic value.

3. The CMOS logic circuit of claim 1 or claim 2 wherein the second stage output is coupled to an inverter for driving an output capacitive load.

4. The CMOS logic circuit of claim 2 wherein said second stage comprises two current paths connected between said second stage output and a reference voltage-receiving node, each of said current paths having a first transistor connected to said second stage output and a second transistor connected to a reference voltage-receiving node, wherein said first and second transistors are connected in series, and said first stage has two outputs each of said outputs being coupled to the control gates of a first transistor and a respective one of said current paths and a second transistor in a respective other current path, said control input comprising said reference voltage-receiving node.

5. The CMOS logic circuit of claim 1 or claim 2 wherein said first stage comprises a plurality of CMOS logic gates, each of said logic gates having P conductivity transistors and N conductivity transistors, wherein the width of the P conductivity transistors of said logic gates is larger than the width of the N transistors of said logic gates.

6. The CMOS logic circuit of claim 2 wherein the first and second transistors of the second stage are N conductivity transistors, and said second stage further comprises at least one P conductivity transistor wherein the width of the N conductivity transistors of said second stage is substantially greater than that of the at least one P conductivity transistor of said second stage.

7. A CMOS logic circuit for driving a capacitive load, having an input circuit and an output circuit, the output circuit having an output to which, in use, said capacitive load is coupled, the input circuit having at least one CMOS logic gate comprising P and N conductivity transistors, wherein a width of the P conductivity transistors is substantially greater than that of the N conductivity transistors whereby said input circuit provides transitions at the output of the output circuit into said capacitive load wherein a first polarity transition is faster than a second opposite polarity transition and said output circuit comprises P conductivity and N conductivity transistors receiving an output from said input circuit and further receiving a control input, whereby dimensions of said P and N type transistors of said output circuit are selected to provide faster output transitions into said capacitive load in said second polarity than in said first polarity.

\* \* \* \* \*